(12) United States Patent
Nishikawa et al.

(10) Patent No.: US 11,201,014 B2
(45) Date of Patent: Dec. 14, 2021

(54) MULTI-LAYER CERAMIC ELECTRONIC COMPONENT AND CIRCUIT BOARD

(71) Applicant: TAIYO YUDEN CO., LTD., Tokyo (JP)

(72) Inventors: Jun Nishikawa, Tokyo (JP); Yasutomo Suga, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 81 days.

(21) Appl. No.: 16/706,096

(22) Filed: Dec. 6, 2019

(65) Prior Publication Data

US 2020/0194184 A1 Jun. 18, 2020

(30) Foreign Application Priority Data

Dec. 14, 2018 (JP) .............................. JP2018-233971

(51) Int. Cl.
| | |
|---|---|
| *H01G 4/30* | (2006.01) |
| *H01G 4/005* | (2006.01) |
| *H05K 1/18* | (2006.01) |
| *H01G 4/12* | (2006.01) |

(52) U.S. Cl.
CPC ............... *H01G 4/30* (2013.01); *H01G 4/005* (2013.01); *H01G 4/1227* (2013.01); *H05K 1/181* (2013.01); *H05K 2201/10015* (2013.01)

(58) Field of Classification Search
CPC ........ H01G 2/065; H01G 4/005; H01G 4/012; H01G 4/12; H01G 4/1227; H01G 4/232; H01G 4/30; H05K 1/18; H05K 1/181; H05K 2201/10015; H05K 3/3442; H05K 2201/10636
See application file for complete search history.

(56) References Cited

U.S. PATENT DOCUMENTS

| | | | | |
|---|---|---|---|---|
| 10,354,801 | B2 * | 7/2019 | Watabe | H01G 4/12 |
| 10,395,830 | B2 * | 8/2019 | Watabe | H01G 4/248 |
| 11,017,952 | B2 * | 5/2021 | Suga | H01G 4/228 |
| 2014/0185189 | A1 * | 7/2014 | Kim | H01G 4/232 |
| | | | | 361/321.2 |
| 2014/0285947 | A1 * | 9/2014 | Suga | H01G 4/30 |
| | | | | 361/301.4 |
| 2016/0093438 | A1 * | 3/2016 | Sasabayashi | H01G 4/12 |
| | | | | 174/260 |
| 2018/0033552 | A1 * | 2/2018 | Lee | H01G 4/012 |
| 2018/0218958 | A1 * | 8/2018 | Suga | H01G 4/232 |

FOREIGN PATENT DOCUMENTS

JP 2014-130999 A 7/2014

\* cited by examiner

*Primary Examiner* — Nathan Milakovich
(74) *Attorney, Agent, or Firm* — Chen Yoshimura LLP

(57) ABSTRACT

A multi-layer ceramic electronic component that satisfies the following: 30 μm≤Ts≤100 μm, 6 μm≤T≤18 μm, and 0.19≤(2T+t)/Ts≤1.55, where Ts represents a dimension of a ceramic body measured along a first axis, T represents a mean value of thickness dimensions of upper and lower portions of an external electrode measured along the first axis that cover edges of top and bottom surfaces of the ceramic body, and t represents a sum of thickness dimensions of internal electrodes drawn to and in contact with the external electrode.

5 Claims, 5 Drawing Sheets

MULTI-LAYER CERAMIC ELECTRONIC COMPONENT AND CIRCUIT BOARD

BACKGROUND ART

The present disclosure relates to a low-profile multi-layer ceramic electronic component and a circuit board incorporating the multi-layer ceramic electronic component.

Along with miniaturization of electronic devices, there are demands for a reduction in height of multi-layer ceramic electronic components. Japanese Patent Application Laid-open No. 2014-130999 discloses a multi-layer ceramic capacitor including a ceramic main body with a thickness of 120 μm or less, for example.

SUMMARY OF THE INVENTION

Along with the reduction in height of the multi-layer ceramic electronic component, the strength thereof is reduced. In particular, the number of internal electrodes, which contribute to an increase in strength, is reduced by half in electrode drawn sections on the end surface sides, to which the internal electrodes are drawn, as compared to the number of internal electrodes at the center portion. Thus, the reduction in strength has become significant, and it has been difficult to enhance reliability.

In view of the circumstances as described above, it is desirable to provide a multi-layer ceramic electronic component that is reduced in height and also capable of enhancing reliability, and a circuit board incorporating the multi-layer ceramic electronic component.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a multi-layer ceramic electronic component, including: a ceramic body having a generally cuboid shape and having a pair of top and bottom surfaces facing in positive and negative directions, respectively, of a first axis, the ceramic body having: a capacitance forming section enclosing internal electrodes laminated in the positive direction of the first axis, and a pair of electrode drawn sections outwardly extending from the capacitance forming section in positive and negative directions, respectively, of a second axis orthogonal to the first axis, the internal electrodes being alternately drawn into the respective electrode drawn sections, wherein the electrode drawn sections respectively have end faces outwardly facing in the positive and negative directions, respectively, of the second axis, the end faces exposing respective edges of the internal electrodes drawn therein; and a pair of external electrodes that respectively cover the electrode drawn sections so as to be in contact with the respective edges of the internal electrodes exposed by the respective end faces of the electrode drawn sections, upper and lower portions of each of the external electrodes covering corresponding edges of the top and bottom surfaces of the ceramic body, wherein the multi-layer ceramic electronic component satisfies the following: 30 μm≤Ts≤100 μm, 6 μm≤T≤18 μm, and 0.19≤(2T+t)/Ts≤1.55, where Ts represents a dimension of the ceramic body measured along the first axis, T represents a mean value of thickness dimensions of said upper and lower portions of one of the external electrodes measured along the first axis that cover the corresponding edges of the top and bottom surfaces of the ceramic body, and t represents a sum of thickness dimensions of the internal electrodes drawn into one of the electrode drawn sections that is covered by said one of the external electrodes.

Satisfying the condition 30 μm≤Ts≤100 μm leads to a low-profile configuration of the multi-layer ceramic electronic component.

Further, satisfying the condition 6 μm≤T≤18 μm makes it possible to thin the external electrode and also prevent fractures due to the extremely thin external electrode from occurring.

Additionally, satisfying the condition 0.19≤(2T+t)/Ts makes it possible to satisfactorily ensure, in the electrode drawn section, the thickness dimensions of the internal and external electrodes having high strength. Accordingly, the strength of the electrode drawn section can be satisfactorily ensured.

Further, satisfying the condition (2T+t)/Ts≤1.55 makes it possible to moderately restrict the thickness dimensions of the internal electrodes and the external electrode with respect to the thickness dimension Ts of the ceramic body. Accordingly, when the ceramic body is sintered or generates heat, stress resulting from a difference in linear expansion coefficient between the ceramic portion and the electrode portion can be suppressed.

As described above, with the configuration described above, it is possible to prevent damages such as cracks in the electrode drawn section, fractures of the external electrode, and the like from occurring and to obtain a multi-layer ceramic electronic component with high reliability.

Additionally, the multi-layer ceramic electronic component may further satisfy 0.40≤(2T+t)/Ts≤1.00.

With this additional configuration, it is possible to obtain a multi-layer ceramic electronic component capable of more satisfactorily ensuring the strength of the electrode drawn section and capable of further suppressing stress between the ceramic portion and the electrode portion.

Additionally, the multi-layer ceramic electronic component may further satisfy 30 μm≤Ts≤80 μm.

With this additional condition, it is possible to configure the multi-layer ceramic electronic component to be reduced more in height and to conserve space.

The multi-layer ceramic electronic component may further satisfy 0.07≤t/Ts≤0.35.

With this additional condition, it is possible to achieve a more appropriate balance between the thickness dimension of the ceramic body and a total thickness dimension of the internal electrodes in the electrode drawn section, and to more reliably prevent damages such as cracks in the electrode drawn section from occurring. Therefore, it is possible to further enhance the reliability of the multi-layer ceramic electronic component.

The multi-layer ceramic electronic component may further satisfy 1≤T/t.

With this additional condition, it is possible to relatively increase the thickness of the external electrode, which covers the entire electrode drawn section and largely contributes to an increase in strength. Therefore, it is possible to further increase the flexural strength in the electrode drawn section.

Further, according to another embodiment of the present disclosure, there is provided a circuit board including the multi-layer ceramic electronic component described above.

Accordingly, the circuit board having high reliability can be provided.

As described above, according to the present disclosure, it is possible to provide a multi-layer ceramic electronic component that is reduced in height and also capable of enhancing reliability.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the invention as claimed.

DETAILED DESCRIPTION OF EMBODIMENTS

Hereinafter, an embodiment of the present disclosure will be described with reference to the drawings.

In the figures, an X axis, a Y axis, and a Z axis orthogonal to one another are shown as appropriate. The X axis, the Y axis, and the Z axis are common in all figures.

1. OVERALL CONFIGURATION OF MULTI-LAYER CERAMIC CAPACITOR 10

Figure 1:
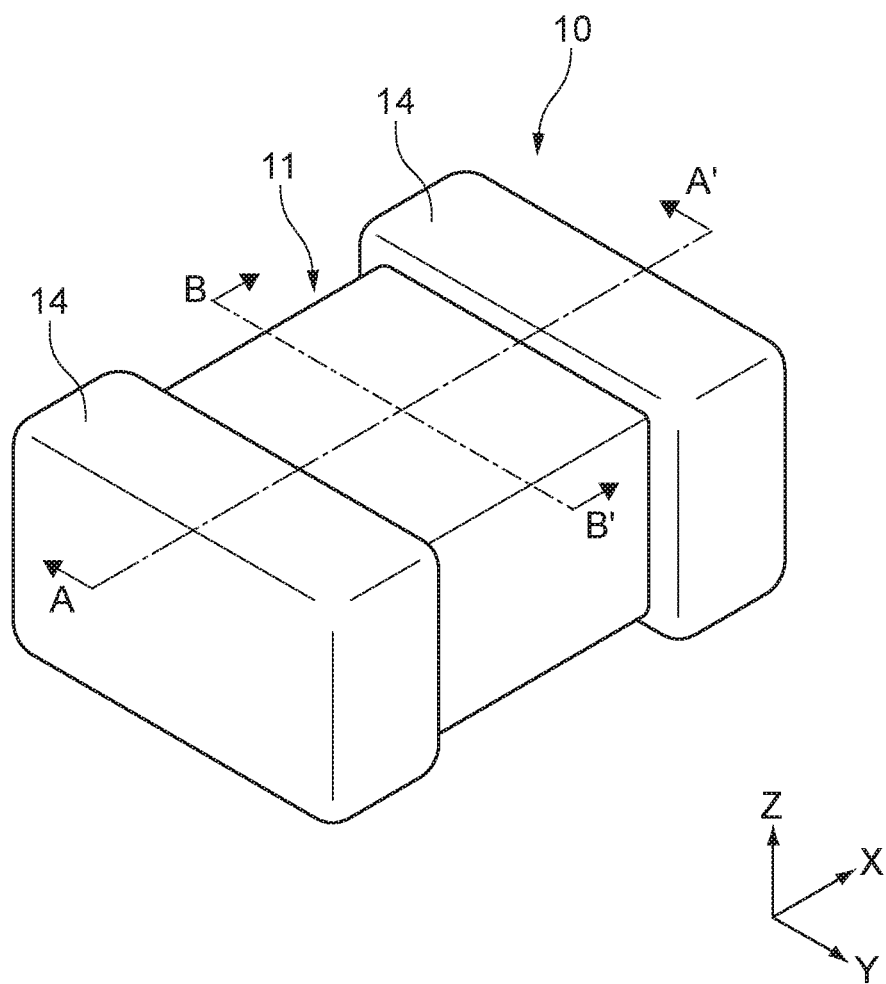
FIG. 1 is a perspective view of a multi-layer ceramic capacitor according to an embodiment of the present disclosure.
Figure 2:
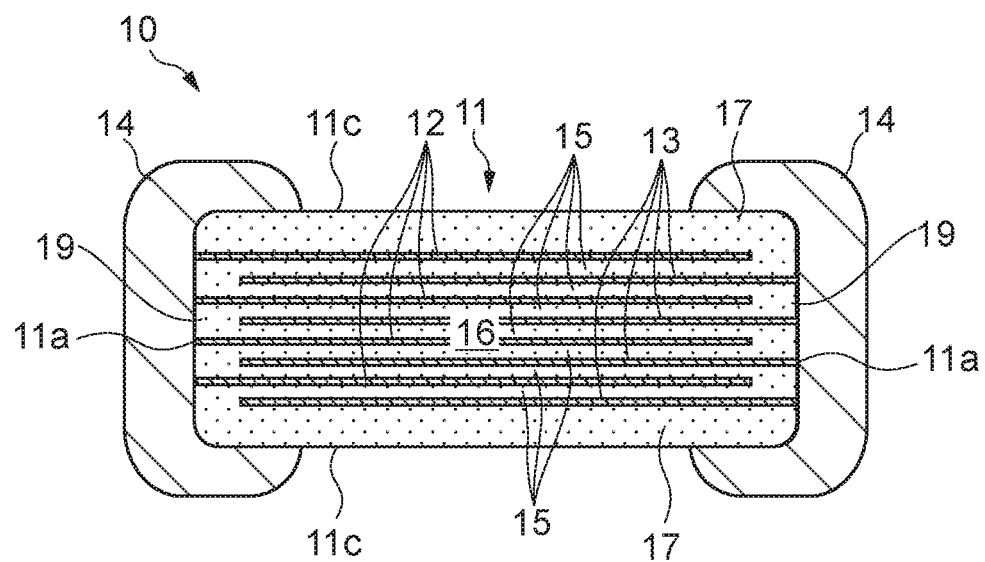
FIG. 2 is a cross-sectional view of the multi-layer ceramic capacitor taken along the A-A' line in FIG. 1.
Figure 3:
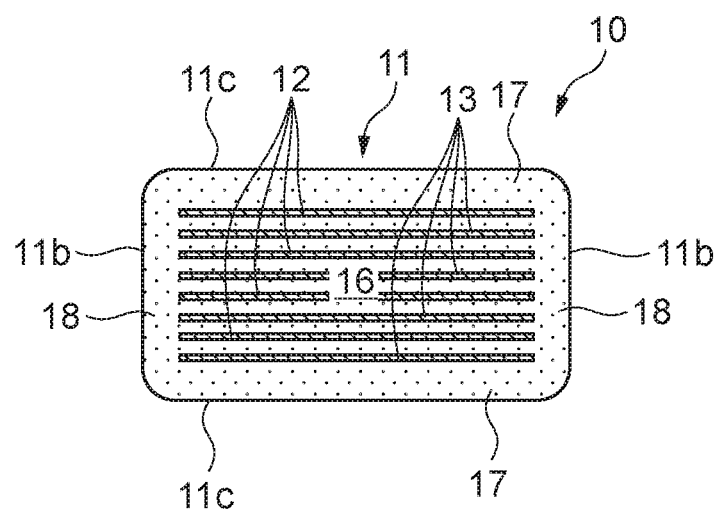
FIG. 3 is a cross-sectional view of the multi-layer ceramic capacitor taken along the B-B' line in FIG. 1.

FIGS. 1 to 3 each show a multi-layer ceramic capacitor 10 according to an embodiment of the present disclosure. FIG. 1 is a perspective view of the multi-layer ceramic capacitor 10. FIG. 2 is a cross-sectional view of the multi-layer ceramic capacitor 10 taken along the A-A' line in FIG. 1. FIG. 3 is a cross-sectional view of the multi-layer ceramic capacitor 10 taken along the B-B' line in FIG. 1.

The multi-layer ceramic capacitor 10 includes a ceramic body 11 and two external electrodes 14. Each of the external electrodes 14 is formed on the surface of the ceramic body 11.

The ceramic body 11 has a substantially hexahedral shape. In other words, the ceramic body 11 has two end surfaces 11a facing in the positive and negative directions, respectively, of the X axis, two side surfaces 11b facing in the positive and negative directions, respectively, of the Y axis, and two main surfaces 11c facing in the positive and negative directions, respectively, of the Z axis. The ceramic body 11 may have a long side in any of the X-axis direction and the Y-axis direction. In the example shown in FIGS. 1 to 3, the ceramic body 11 has a long side in the X-axis direction.

For the size of the multi-layer ceramic capacitor 10, for example, a dimension in the X-axis direction is 0.2 mm to 2.0 mm, and a dimension in the Y-axis direction is 0.2 mm to 2.0 mm. A dimension of the multi-layer ceramic capacitor 10 in the Z-axis direction is, for example, 120 μm or less, and the multi-layer ceramic capacitor 10 is configured to be reduced in height. It should be noted that each dimension of the multi-layer ceramic capacitor 10 is assumed as a dimension of a largest portion along each direction.

Additionally, in the multi-layer ceramic capacitor 10, the smaller one of the dimension in the X-axis direction and the dimension in the Y-axis direction can be set to be twice or more times the dimension in the Z-axis direction. Accordingly, the multi-layer ceramic capacitor 10 can be formed to have a flatter and smaller configuration.

The ceramic body 11 includes a capacitance forming section 16, top and bottom covers 17, side covers 18, and electrode drawn sections 19. The capacitance forming section 16 is disposed at the center portion of the ceramic body 11 in the Y- and Z-axis directions. The covers 17 cover the capacitance forming section 16 from the positive and negative Z-axis directions, respectively, and the side covers 18 cover the capacitance forming section 16 from the positive and negative Y-axis directions. The electrode drawn sections 19 are disposed on the outside of the capacitance forming section 16 in the X-axis direction.

More specifically, the covers 17 are disposed on both sides of the capacitance forming section 16 in the Z-axis direction. The side covers 18 are disposed on both sides of the capacitance forming section 16 in the Y-axis direction. The covers 17 and the side covers 18 have main functions of protecting the capacitance forming section 16 and ensuring insulation properties of the periphery of the capacitance forming section 16. The electrode drawn sections 19 will be described later in detail.

The capacitance forming section 16 includes a plurality of first internal electrodes 12 and a plurality of second internal electrodes 13, which are alternately laminated in the Z-axis direction via ceramic layers 15 (see FIG. 2).

Figure 4:
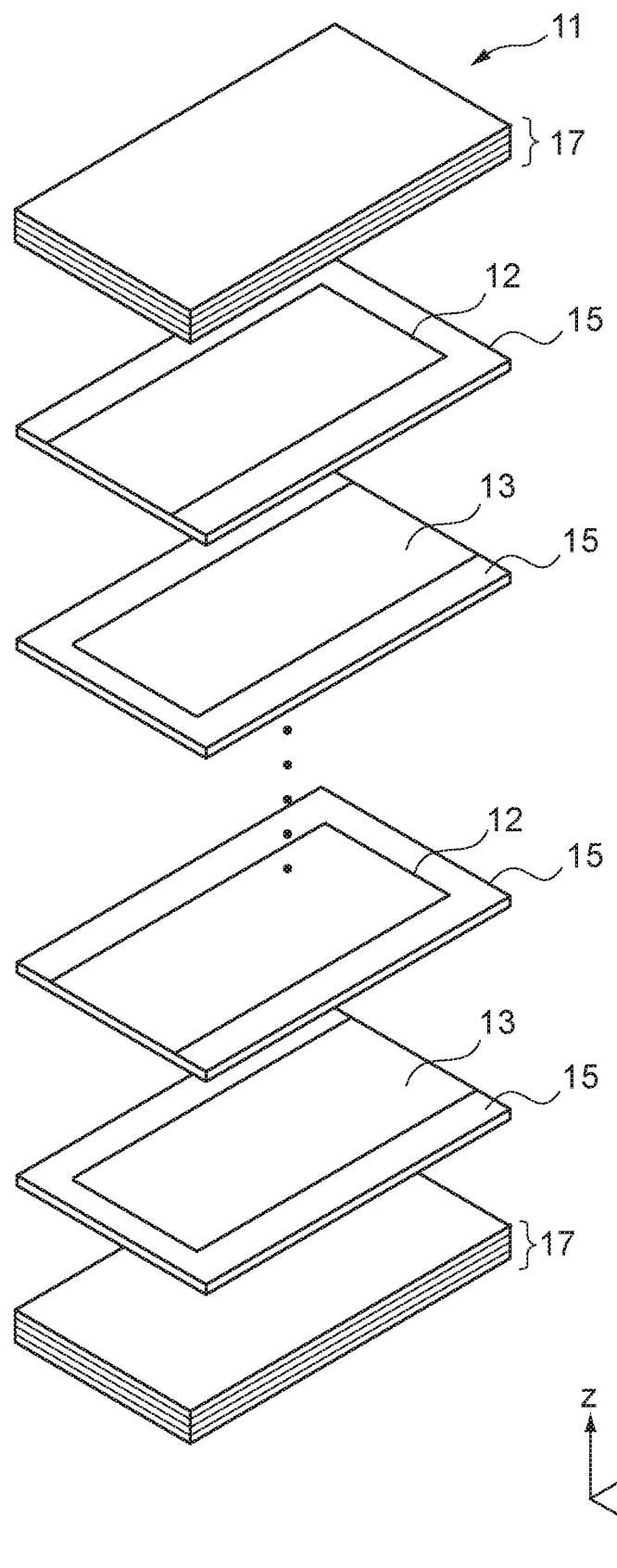
FIG. 4 is an exploded perspective view of a ceramic body of the multi-layer ceramic capacitor.

FIG. 4 is an exploded perspective view of the ceramic body 11. The ceramic body 11 has a structure in which sheets are laminated as shown in FIG. 4. The capacitance forming section 16 and the side covers 18 can be formed of sheets on which the first internal electrodes 12 and the second internal electrodes 13 are printed. The covers 17 can be formed of sheets on which the first internal electrodes 12 and the second internal electrodes 13 are not printed. It should be noted that the produced ceramic body 11 is actually integrated and is difficult to decompose.

The first internal electrodes 12 and the second internal electrodes 13 are each formed of a good conductor of electricity and function as internal electrodes of the multi-layer ceramic capacitor 10. Examples of the good conductor of electricity forming the first and second internal electrodes 12 and 13 include a metal mainly containing nickel (Ni), copper (Cu), palladium (Pd), platinum (Pt), silver (Ag), gold (Au), or the like, and an alloy of those metals.

The ceramic layers 15 are formed of dielectric ceramics. In the multi-layer ceramic capacitor 10, in order to increase a capacitance of each ceramic layer 15 provided between the first internal electrode 12 and the second internal electrode 13, dielectric ceramics having a high dielectric constant is used. Examples of the dielectric ceramics having a high dielectric constant include a material having a Perovskite structure containing barium (Ba) and titanium (Ti), which is typified by barium titanate ($BaTiO_3$).

Further, the dielectric ceramics may be a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate (BaZrO$_3$) based material, and a titanium oxide (TiO$_2$) based material, other than a barium titanate based material.

The covers 17 and the side covers 18 are also formed of dielectric ceramics. The material forming the covers 17 and the side covers 18 only needs to be insulating ceramics, but if a material having a composition system similar to that of the capacitance forming section 16 is used therefor, production efficiency is increased, and internal stress in the ceramic body 11 is suppressed.

The electrode drawn sections 19 extend from the capacitance forming section 16 in the positive and negative X-axis directions, respectively. The first internal electrodes 12 and the second internal electrodes 13 are drawn to the respective electrode drawn sections 19. The first internal electrodes 12 are drawn to one of the end surfaces 11a via one of the electrode drawn sections 19. The second internal electrodes 13 are drawn to the other end surface 11a via the other electrode drawn section 19. In each of the electrode drawn sections 19, the first internal electrodes 12 or the second internal electrodes 13 are laminated in the Z-axis direction via the ceramic layers 15.

Each of the external electrodes 14 continuously covers each end surface 11a and part of the pair of main surfaces 11c. In other words, the electrode drawn sections 19 are covered with the external electrodes 14. Accordingly, the first internal electrodes 12 are connected to one of the external electrodes 14, and the second internal electrodes 13 are connected to the other external electrode 14.

With the configuration described above, when a voltage is applied between the external electrodes 14 in the multi-layer ceramic capacitor 10, the voltage is applied to the plurality of ceramic layers 15 provided between the first internal electrodes 12 and the second internal electrodes 13 in the capacitance forming section 16. With this configuration, the multi-layer ceramic capacitor 10 stores charge corresponding to the voltage applied between the external electrodes 14.

2. DETAILED CONFIGURATION OF MULTI-LAYER CERAMIC CAPACITOR 10

Figure 5:
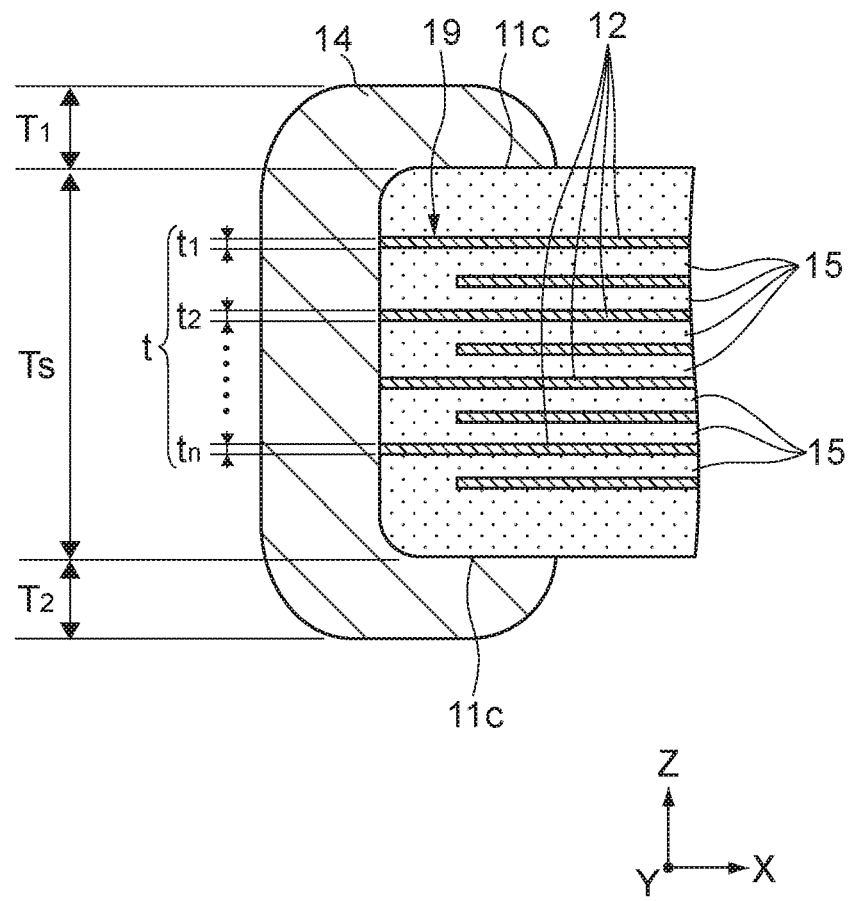
FIG. 5 is an enlarged view of FIG. 2.

FIG. 5 is an enlarged view of FIG. 2 and is also a view showing a configuration of one of the electrode drawn sections 19 and the vicinity thereof in the multi-layer ceramic capacitor 10. Hereinafter, a configuration of the side to which the first internal electrodes 12 are drawn will be described with reference to FIG. 5, but the side to which the second internal electrodes 13 are drawn is also configured in a similar manner.

The multi-layer ceramic capacitor 10 is configured to be reduced in height as described above, and a thickness dimension Ts of the ceramic body 11 in the Z-axis direction satisfies a condition of the following expression (1).

$$30 \text{ μm} \leq Ts \leq 100 \text{ μm} \tag{1}$$

The thickness dimension Ts of the ceramic body 11 in the Z-axis direction used herein is a dimension of the thickest portion in the Z-axis direction on a cross-sectional surface cut along a surface vertical to the Y-axis direction at the substantially center of the ceramic body 11 in the Y-axis direction as shown in FIG. 2. Among the portions of the ceramic body 11 where the electrode drawn section 19 is present, the thickest portion in the Z-axis direction is also approximately equal to the dimension Ts.

In such a low-profile multi-layer ceramic capacitor 10, a space-saving configuration can be achieved, whereas the number of first and second internal electrodes 12 and 13 is limited. Additionally, in the electrode drawn section 19, the number of first and second internal electrodes 12 and 13 is reduced by half as compared to the number of first and second internal electrodes 12 and 13 in the capacitance forming section 16. In general, the first internal electrodes 12, the second internal electrodes 13, and the external electrodes 14, which are made of metal material, have higher mechanical strength than that of a ceramic portion such as the ceramic layers 15. For that reason, in the low-profile multi-layer ceramic capacitor 10, it is difficult to ensure the mechanical strength particularly in the electrode drawn sections 19 when an external force is applied thereto.

In this regard, in this embodiment, the thickness dimension of each of the first and second internal electrodes 12 and 13 and the thickness dimension of the external electrode 14 in the Z-axis direction with respect to the thickness dimension Ts of the ceramic body 11 are defined to ensure the strength of the electrode drawn sections 19 and enhance the reliability of the electrode drawn sections 19.

As shown in FIG. 5, the sum of the thickness dimensions of the first internal electrodes 12 in the Z-axis direction is represented by t. t is expressed by the following expression (2).

$$t = t1 + t2 + \ldots + tn{-}1 + tn \tag{2}$$

where n represents the number of internal electrodes in the electrode drawn section 19, and tk (k=1, 2, ..., n−1, n) represents the thickness dimension of each first internal electrode 12.

It should be noted that tk is a dimension of the thickest portion of each first internal electrode 12 in the Z-axis direction in the electrode drawn section 19, on a cross-sectional surface cut along a surface vertical to the Y-axis direction at the substantially center of the multi-layer ceramic capacitor 10 in the Y-axis direction as shown in FIG. 2.

A mean value of two largest thickness dimensions of the external electrode 14 in the Z-axis direction on the pair of main surfaces 11c is assumed as T. T is expressed by the following expression (3).

$$T = (T1 + T2)/2 \tag{3}$$

where T1 represents a thickness dimension of the external electrode 14 in the Z-axis direction on one of the main surfaces 11c, and T2 represents a thickness dimension of the external electrode 14 in the Z-axis direction on the other main surface 11c.

It should be noted that T1 and T2 are the dimensions of the thickest portions of each external electrode 14 in the Z-axis direction on the main surfaces 11c in the electrode drawn section 19, on a cross-sectional surface cut along a surface vertical to the Y-axis direction at the substantially center of the multi-layer ceramic capacitor 10 in the Y-axis direction as shown in FIG. 2.

T satisfies a condition of the following expression (4).

$$6 \text{ μm} \leq T \leq 18 \text{ μm} \tag{4}$$

Setting T to 6 μm or more can prevent the occurrence of defects such as fractures due to an extremely thin external electrode 14. Setting T to 18 μm or less can restrict the entire thickness dimension of the multi-layer ceramic capacitor 10 and achieve a low-profile configuration.

Additionally, the multi-layer ceramic capacitor 10 satisfies a condition of the following expression (5) in addition to the expression (1) and the expression (4).

$$0.19 \leq (2T + t)/Ts \leq 1.55 \tag{5}$$

(2T+t) is the sum of the thickness dimensions of the first internal electrodes 12 and the external electrode 14 in the Z-axis direction, which is obtained when the electrode drawn section 19 is cut along the Z-axis direction.

Satisfying the expression of 0.19≤(2T+t)/Ts makes it possible to satisfactorily ensure, in the electrode drawn section 19, the thickness dimensions of the first internal electrodes 12 and external electrode 14 having high strength, with respect to the thickness dimension Ts of the ceramic body 11. Accordingly, the mechanical strength of the electrode drawn section 19 can be satisfactorily ensured. Therefore, even if an external force is applied due to the deflection of the board or the like after the multi-layer ceramic capacitor 10 is mounted on a board, cracks can be effectively prevented from occurring in the electrode drawn section 19.

Further, satisfying the expression of (2T+t)/Ts≤1.55 makes it possible to restrict the thickness dimensions of the first internal electrodes 12 and the external electrode 14 with respect to the thickness dimension Ts of the ceramic body 11. Accordingly, when the ceramic body 11 generates heat, stress resulting from a difference in linear expansion coefficient between the ceramic portion and the electrode portion can be suppressed. Therefore, cracks resulting from the stress due to heat can be prevented from occurring in the electrode drawn section 19.

As described above, when the dimensions Ts, t, and T of the multi-layer ceramic capacitor 10 satisfy the expression (1), the expression (4), and the expression (5), the multi-layer ceramic capacitor 10 can have sufficient strength in the electrode drawn section 19 while being reduced in height, and damages such as generation of cracks can be prevented from occurring. Accordingly, after the multi-layer ceramic capacitor 10 is mounted on a board, even if an external force is applied due to the deflection of the board or the like or if the stress due to heat is generated within the element, cracks can be prevented from occurring in the ceramic body 11 including the electrode drawn section 19.

If cracks occur, environmental resistance such as moisture resistance is lowered, which leads to a reduction in reliability. Therefore, if cracks can be prevented from occurring, a low-profile multi-layer ceramic capacitor 10 having high reliability can be provided.

Additionally, the multi-layer ceramic capacitor 10 may satisfy a condition of the following expression (6) in association with the expression (5).

$$0.40 \leq (2T+t)/Ts \leq 1.00 \quad (6)$$

Satisfying the expression of 0.40≤(2T+t) makes it possible to satisfactorily ensure the strength of the electrode drawn section 19. Satisfying the expression of (2T+t)/Ts≤1.00 makes it possible to further suppress the stress between the ceramic portion and the electrode portion and to more reliably prevent the generation of cracks.

Additionally, the multi-layer ceramic capacitor 10 may satisfy a condition of the following expression (7) in association with the expression (1).

$$30 \ \mu m \leq Ts \leq 80 \ \mu m \quad (7)$$

Accordingly, the multi-layer ceramic capacitor 10 can be further reduced in height and have a space-saving configuration.

Additionally, the multi-layer ceramic capacitor 10 may satisfy a condition of the following expression (8).

$$0.07 \leq t/Ts \leq 0.35 \quad (8)$$

Satisfying the expression of 0.07≤t/Ts makes it possible to increase the proportion of the first internal electrodes 12 in the electrode drawn section 19 and to enhance the strength of the electrode drawn section 19. Satisfying the expression of t/Ts≤0.35 makes it possible to more reliably prevent the generation of the cracks resulting from a difference in linear expansion coefficient between the ceramic layers 15 and the first internal electrodes 12 in the electrode drawn section 19.

Additionally, the multi-layer ceramic capacitor 10 may satisfy a condition of the following expression (9).

$$1 \leq T/t \quad (9)$$

In other words, the thickness dimension T of the external electrode 14 may be equal to or larger than the sum t of the thickness dimensions of the first internal electrodes 12 in each electrode drawn section 19. The external electrode 14 externally covers the entire electrode drawn section 19 from the end surface 11a to the main surfaces 11c, and thus largely contributes to an increase in flexural strength of the electrode drawn section 19 with respect to the Z-axis direction. Satisfying the expression (9) makes it possible to form a relatively thick external electrode 14 and further improve the flexural strength of the electrode drawn section 19. Therefore, the reliability of the multi-layer ceramic capacitor 10 can be enhanced.

Figure 6:
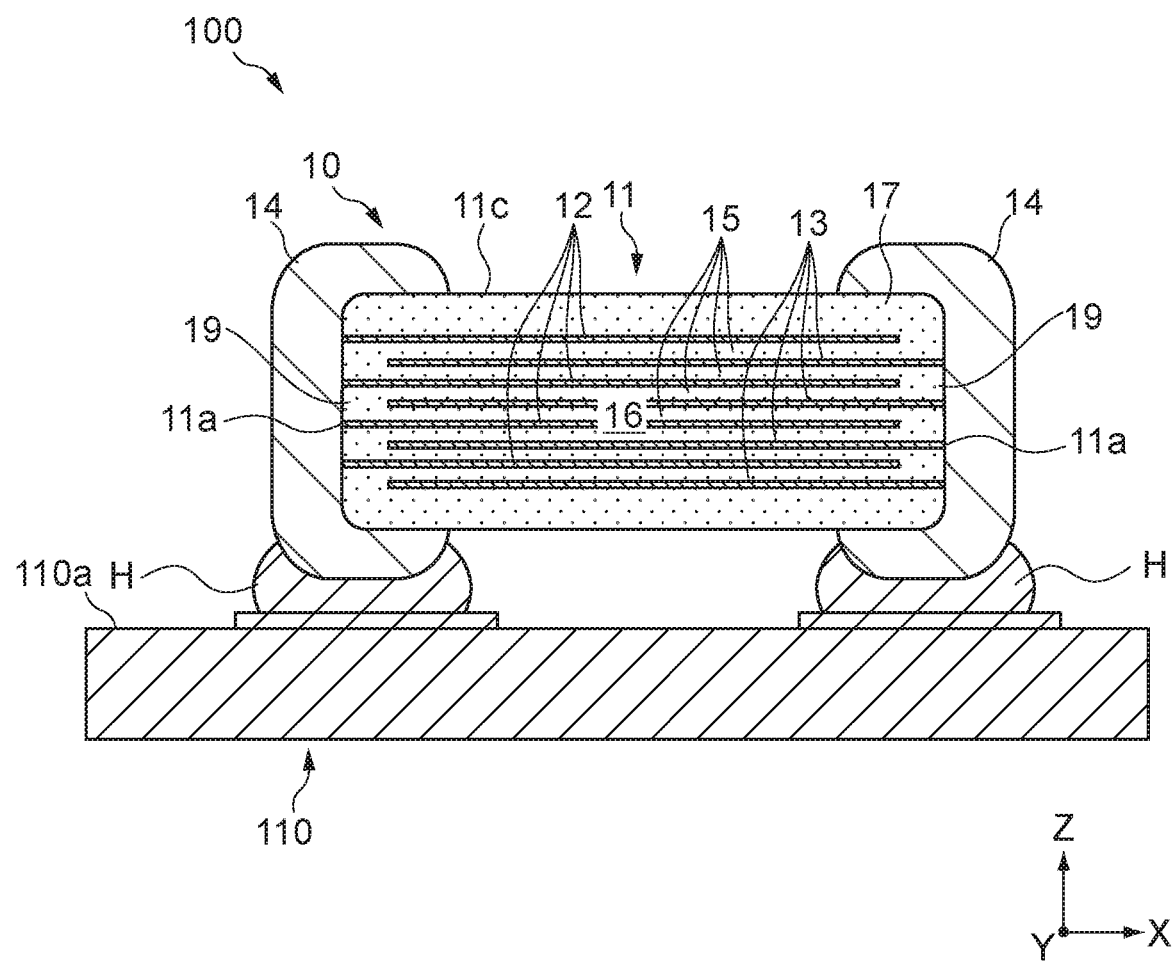
FIG. 6 is a cross-sectional view of a circuit board incorporating the multi-layer ceramic capacitor.

The multi-layer ceramic capacitor 10 thus configured may be incorporated into a circuit board 100 as shown in FIG. 6. The circuit board 100 includes, for example, the multi-layer ceramic capacitor 10 and a board main body 110 connected to the multi-layer ceramic capacitor 10. The board main body 110 is configured as, for example, a mounting board having a mount surface 110a, which is connected to the multi-layer ceramic capacitor 10 via solder H. In the circuit board 100 of this embodiment, the multi-layer ceramic capacitor 10 can be mounted while saving space, and high reliability can also be obtained.

It should be noted that the circuit board 100 is not limited to the example shown in the figure. For example, the circuit board 100 may be configured as a substrate with built-in components, which incorporates the multi-layer ceramic capacitor 10.

3. EXAMPLES AND COMPARATIVE EXAMPLES

As Examples and Comparative examples of this embodiment, samples of the multi-layer ceramic capacitor were produced as follows.

First, ceramic green sheets mainly containing barium titanate and also containing an organic binder, a solvent, and the like were formed. An electrically conductive paste containing Ni was printed as internal electrodes on the ceramic green sheets. The ceramic green sheets were laminated and pressure-bonded as shown in FIG. 4 to be cut at predetermined positions, and unsintered ceramic bodies were produced.

Subsequently, an electrically conductive paste containing Ni for forming external electrodes was applied to the end surfaces of the ceramic body and sintered at 1,000 to 1,400° C., and a sintered body including the ceramic body shown in FIGS. 1 to 3 was obtained. External electrodes were then formed on the sintered film of the electrically conductive paste by plating or the like, and samples of the multi-layer ceramic capacitor shown in FIGS. 1 to 3 were produced.

A dimension of each sample in the X-axis direction was set to 1.0 mm, and a dimension of each sample in the Y-axis direction was set to 0.5 mm. Further, a plurality of samples were produced, which were different from one another in the dimension Ts of the ceramic body in the Z-axis direction (hereinafter, referred to as thickness dimension Ts of ceramic body), the mean value T of the thickness dimensions of the external electrode in the Z-axis direction on the pair of main surfaces (hereinafter, referred to as thickness dimension T of external electrode), and the sum t of the thickness dimensions of the internal electrodes in the Z-axis direction in the electrode drawn section (hereinafter, referred to as the sum t of thickness dimensions of internal electrodes). Those samples were assumed as Examples 1 to 93 and Comparative examples 1 to 19. The following Tables 1 to 4 show the dimensions of the samples in Examples and Comparative examples.

The thickness dimension Ts of the ceramic body of each sample was 100 μm, 80 μm, 50 μm, and 30 μm. The thickness dimension T of the external electrode of each sample was 4 μm or more and 21 μm or less. The sum t of the thickness dimensions of the internal electrodes was 5.3 μm or more and 12.7 μm or less. It should be noted that the measurement was performed by observation using a scanning electron microscope from the field of view of FIG. 5.

However, the samples in which the thickness dimension T of the external electrode was 21 μm each had an extremely thick external electrode with respect to the thickness dimension Ts of the ceramic body, resulting in having an unsuitable structure as a low-profile multi-layer ceramic capacitor. Therefore, the following evaluation was performed on the samples in which the thickness dimension T of the external electrode was 4 μm or more and 18 μm or less.

For each of Examples and Comparative examples, the value of $(2T+t)/Ts$ was calculated on the basis of the measured and calculated values of Ts, T, and t. The following Tables 1 to 4 show the calculation results.

Subsequently, each sample produced was mounted on a board by using a mounter, and then visually inspected for the presence/absence of damages. Specifically, in the 1,000 samples of each of Examples and Comparative examples, the presence/absence of cracks of the ceramic body and fractures of the external electrodes was confirmed. Examples and Comparative examples having samples without those damages were evaluated as A, and Examples and Comparative examples having samples with at least one of those damages were evaluated as B.

Table 1 shows the results of Examples 1 to 22 and Comparative examples 1 to 6, in which the thickness dimension Ts of the ceramic body is 100 μm.

TABLE 1

| | T (um) | t (um) | Ts (um) | (2T + t)/Ts | Evaluation |
|---|---|---|---|---|---|
| Example 1 | 18 | 5.3 | 100 | 0.41 | A |
| Example 2 | 18 | 6.1 | 100 | 0.42 | A |
| Example 3 | 18 | 6.6 | 100 | 0.43 | A |
| Example 4 | 18 | 8.3 | 100 | 0.44 | A |
| Example 5 | 18 | 10.6 | 100 | 0.47 | A |
| Example 6 | 18 | 12.7 | 100 | 0.49 | A |
| Example 7 | 15 | 5.3 | 100 | 0.35 | A |
| Example 8 | 15 | 6.1 | 100 | 0.36 | A |
| Example 9 | 15 | 6.6 | 100 | 0.37 | A |
| Example 10 | 15 | 8.3 | 100 | 0.38 | A |
| Example 11 | 15 | 10.6 | 100 | 0.41 | A |
| Example 12 | 15 | 12.7 | 100 | 0.43 | A |
| Example 13 | 12 | 4.5 | 100 | 0.29 | A |
| Example 14 | 12 | 5.0 | 100 | 0.29 | A |
| Example 15 | 12 | 6.6 | 100 | 0.31 | A |
| Example 16 | 12 | 8.3 | 100 | 0.32 | A |
| Example 17 | 12 | 10.6 | 100 | 0.35 | A |
| Example 18 | 12 | 12.7 | 100 | 0.37 | A |
| Comparative example 1 | 6 | 4.5 | 100 | 0.17 | B |
| Comparative example 2 | 6 | 5.0 | 100 | 0.17 | B |
| Example 19 | 6 | 6.6 | 100 | 0.19 | A |
| Example 20 | 6 | 8.3 | 100 | 0.20 | A |
| Example 21 | 6 | 10.6 | 100 | 0.23 | A |
| Example 22 | 6 | 12.7 | 100 | 0.25 | A |
| Comparative example 3 | 4 | 6.6 | 100 | 0.15 | B |
| Comparative example 4 | 4 | 8.3 | 100 | 0.16 | B |
| Comparative example 5 | 4 | 10.6 | 100 | 0.19 | B |
| Comparative example 6 | 4 | 12.7 | 100 | 0.21 | B |

As shown in Table 1, Comparative examples 3 to 6, in which the thickness dimension T of the external electrode is 4 μm, had samples with fractures of the external electrodes and were given an appearance evaluation of B. Among the samples, in which the thickness dimension T of the external electrode is 6 μm or more and 18 μm or less, Comparative examples 1 and 2 having a small value of $(2T+t)/Ts$, 0.17, had samples with cracks of the ceramic body and were given an evaluation of B. In each of Examples 1 to 22, in which the thickness dimension T of the external electrode is set to 6 μm or more and 18 μm or less, and a condition where $0.19 \leq (2T+t)/Ts \leq 0.49$ is satisfied, the number of occurrence of damages was zero and evaluations therefor were A.

Table 2 shows the results of Examples 23 to 46 and Comparative examples 7 to 10, in which the thickness dimension Ts of the ceramic body is 80 μm.

TABLE 2

| | T (um) | t (um) | Ts (um) | (2T + t)/Ts | Evaluation |
|---|---|---|---|---|---|
| Example 23 | 18 | 5.3 | 80 | 0.52 | A |
| Example 24 | 18 | 6.1 | 80 | 0.53 | A |
| Example 25 | 18 | 6.6 | 80 | 0.53 | A |
| Example 26 | 18 | 8.3 | 80 | 0.55 | A |
| Example 27 | 18 | 10.6 | 80 | 0.58 | A |
| Example 28 | 18 | 12.7 | 80 | 0.61 | A |
| Example 29 | 15 | 5.3 | 80 | 0.44 | A |
| Example 30 | 15 | 6.1 | 80 | 0.45 | A |
| Example 31 | 15 | 6.6 | 80 | 0.46 | A |
| Example 32 | 15 | 8.3 | 80 | 0.48 | A |
| Example 33 | 15 | 10.6 | 80 | 0.51 | A |
| Example 34 | 15 | 12.7 | 80 | 0.53 | A |
| Example 35 | 12 | 4.5 | 80 | 0.36 | A |
| Example 36 | 12 | 5.0 | 80 | 0.36 | A |
| Example 37 | 12 | 6.6 | 80 | 0.38 | A |
| Example 38 | 12 | 8.3 | 80 | 0.40 | A |
| Example 39 | 12 | 10.6 | 80 | 0.43 | A |
| Example 40 | 12 | 12.7 | 80 | 0.46 | A |
| Example 41 | 6 | 4.5 | 80 | 0.21 | A |
| Example 42 | 6 | 5.0 | 80 | 0.21 | A |
| Example 43 | 6 | 6.6 | 80 | 0.23 | A |
| Example 44 | 6 | 8.3 | 80 | 0.25 | A |
| Example 45 | 6 | 10.6 | 80 | 0.28 | A |
| Example 46 | 6 | 12.7 | 80 | 0.31 | A |
| Comparative example 7 | 4 | 6.6 | 80 | 0.18 | B |
| Comparative example 8 | 4 | 8.3 | 80 | 0.20 | B |
| Comparative example 9 | 4 | 10.6 | 80 | 0.23 | B |
| Comparative example 10 | 4 | 12.7 | 80 | 0.26 | B |

As shown in Table 2, Comparative examples 7 to 10, in which the thickness dimension T of the external electrode is 4 μm, had samples with fractures of the external electrodes and were given an appearance evaluation of B. In each of Examples 23 to 46, in which the thickness dimension T of the external electrode is set to 6 μm or more and 18 μm or less, and a condition where $0.21 \leq (2T+t)/Ts \leq 0.61$ is satisfied, the number of occurrence of damages was zero and evaluations therefor were A.

Table 3 shows the results of Examples 47 to 70 and Comparative examples 11 to 14, in which the thickness dimension Ts of the ceramic body is 50 μm.

TABLE 3

| | T (um) | t (um) | Ts (um) | (2T + t)/Ts | Evaluation |
|---|---|---|---|---|---|
| Example 47 | 18 | 5.3 | 50 | 0.83 | A |
| Example 48 | 18 | 6.1 | 50 | 0.84 | A |
| Example 49 | 18 | 6.6 | 50 | 0.85 | A |
| Example 50 | 18 | 8.3 | 50 | 0.89 | A |
| Example 51 | 18 | 10.6 | 50 | 0.93 | A |
| Example 52 | 18 | 12.7 | 50 | 0.97 | A |
| Example 53 | 15 | 5.3 | 50 | 0.71 | A |
| Example 54 | 15 | 6.1 | 50 | 0.72 | A |
| Example 55 | 15 | 6.6 | 50 | 0.73 | A |
| Example 56 | 15 | 8.3 | 50 | 0.77 | A |
| Example 57 | 15 | 10.6 | 50 | 0.81 | A |
| Example 58 | 15 | 12.7 | 50 | 0.85 | A |
| Example 59 | 12 | 4.5 | 50 | 0.57 | A |
| Example 60 | 12 | 5.0 | 50 | 0.58 | A |
| Example 61 | 12 | 6.6 | 50 | 0.61 | A |
| Example 62 | 12 | 8.3 | 50 | 0.65 | A |
| Example 63 | 12 | 10.6 | 50 | 0.69 | A |
| Example 64 | 12 | 12.7 | 50 | 0.73 | A |
| Example 65 | 6 | 4.5 | 50 | 0.33 | A |
| Example 66 | 6 | 5.0 | 50 | 0.34 | A |
| Example 67 | 6 | 6.6 | 50 | 0.37 | A |
| Example 68 | 6 | 8.3 | 50 | 0.41 | A |
| Example 69 | 6 | 10.6 | 50 | 0.45 | A |
| Example 70 | 6 | 12.7 | 50 | 0.49 | A |
| Comparative example 11 | 4 | 6.6 | 50 | 0.29 | B |
| Comparative example 12 | 4 | 8.3 | 50 | 0.33 | B |
| Comparative example 13 | 4 | 10.6 | 50 | 0.37 | B |
| Comparative example 14 | 4 | 12.7 | 50 | 0.41 | B |

As shown in Table 3, Comparative examples 11 to 14, in which the thickness dimension T of the external electrode is 4 μm, had samples with fractures of the external electrodes and were given an appearance evaluation of B. In each of Examples 47 to 70, in which the thickness dimension T of the external electrode is set to 6 μm or more and 18 μm or less, and a condition where 0.33≤(2T+t)/Ts≤0.97 is satisfied, the number of occurrence of damages was zero and evaluations therefor were A.

Table 4 shows the results of Examples 71 to 93 and Comparative examples 15 to 19, in which the thickness dimension Ts of the ceramic body is 30 μm.

TABLE 4

| | T (um) | t (um) | Ts (um) | (2T + t)/Ts | Evaluation |
|---|---|---|---|---|---|
| Example 71 | 18 | 5.3 | 30 | 1.38 | A |
| Example 72 | 18 | 6.1 | 30 | 1.40 | A |
| Example 73 | 18 | 6.6 | 30 | 1.42 | A |
| Example 74 | 18 | 8.3 | 30 | 1.48 | A |
| Example 75 | 18 | 10.6 | 30 | 1.55 | A |
| Comparative example 15 | 18 | 12.7 | 30 | 1.62 | B |
| Example 76 | 15 | 5.3 | 30 | 1.18 | A |
| Example 77 | 15 | 6.1 | 30 | 1.20 | A |
| Example 78 | 15 | 6.6 | 30 | 1.22 | A |
| Example 79 | 15 | 8.3 | 30 | 1.28 | A |
| Example 80 | 15 | 10.6 | 30 | 1.35 | A |
| Example 81 | 15 | 12.7 | 30 | 1.42 | A |
| Example 82 | 12 | 4.5 | 30 | 0.95 | A |
| Example 83 | 12 | 5.0 | 30 | 0.97 | A |
| Example 84 | 12 | 6.6 | 30 | 1.02 | A |
| Example 85 | 12 | 8.3 | 30 | 1.08 | A |
| Example 86 | 12 | 10.6 | 30 | 1.15 | A |
| Example 87 | 12 | 12.7 | 30 | 1.22 | A |
| Example 88 | 6 | 4.5 | 30 | 0.55 | A |
| Example 89 | 6 | 5.0 | 30 | 0.57 | A |
| Example 90 | 6 | 6.6 | 30 | 0.62 | A |
| Example 91 | 6 | 8.3 | 30 | 0.68 | A |
| Example 92 | 6 | 10.6 | 30 | 0.75 | A |
| Example 93 | 6 | 12.7 | 30 | 0.82 | A |
| Comparative example 16 | 4 | 6.6 | 30 | 0.49 | B |
| Comparative example 17 | 4 | 8.3 | 30 | 0.54 | B |
| Comparative example 18 | 4 | 10.6 | 30 | 0.62 | B |
| Comparative example 19 | 4 | 12.7 | 30 | 0.69 | B |

As shown in Table 4, Comparative examples 16 to 19, in which the thickness dimension T of the external electrode is 4 μm, had samples with fractures of the external electrodes and were given an appearance evaluation of B. Among the samples, in which the thickness dimension T of the external electrode is 6 μm or more and 18 μm or less, Comparative example 15 having a large value of (2T+t)/Ts, 1.62, had samples with cracks of the ceramic body and were given an evaluation of B. In each of Examples 71 to 93, in which the thickness dimension T of the external electrode is set to 6 μm or more and 18 μm or less, and a condition where 0.55≤(2T+t)/Ts≤1.55 is satisfied, the number of occurrence of damages was zero and evaluations therefor were A.

From those results, it was confirmed that when the thickness dimension T of the external electrode is set to 6 μm≤T≤18 μm and a condition where 0.19≤(2T+t)/Ts≤1.55 is satisfied for the low-profile multi-layer ceramic capacitor satisfying a condition where 30 μm≤Ts≤100 μm, damages such as cracks of the ceramic body and fractures of the external electrodes can be reliably prevented from occurring. Therefore, it was confirmed that satisfying the above conditions provides a multi-layer ceramic capacitor with high environmental resistance such as moisture resistance.

While the embodiments of the present disclosure have been described, the present disclosure is not limited to the embodiments described above, and it should be appreciated that the present disclosure may be variously modified without departing from the gist of the present disclosure. For example, the embodiment of the present disclosure can be an embodiment in which some embodiments are combined.

In the embodiment described above, the multi-layer ceramic capacitor 10 has been described as an example of a multi-layer ceramic electronic component, but the present disclosure can be applied to any other multi-layer ceramic electronic components each including laminated ceramic layers and internal electrodes. Examples of such multi-layer ceramic electronic components include a chip varistor, a chip thermistor, and a multi-layer inductor.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A multi-layer ceramic electronic component, comprising:
a ceramic body having a generally cuboid shape and having a pair of top and bottom surfaces facing in positive and negative directions, respectively, of a first axis and a pair of side surfaces facing in positive and negative directions, respectively, of a second axis that is orthogonal to the first axis, the ceramic body having:

a capacitance forming section enclosing internal electrodes laminated in the positive direction of the first axis, and a pair of electrode drawn sections outwardly extending from the capacitance forming section in positive and negative directions, respectively, of a third axis orthogonal to the first axis and the second axis, the internal electrodes being alternately drawn into the respective electrode drawn sections, wherein the electrode drawn sections respectively have end faces outwardly facing in the positive and negative directions, respectively, of the third axis, the end faces exposing respective edges of the internal electrodes drawn therein; and a pair of external electrodes that respectively cover the electrode drawn sections so as to be in contact with the respective edges of the internal electrodes exposed by the respective end faces of the electrode drawn sections, upper and lower portions of each of the external electrodes covering corresponding edges of the top and bottom surfaces of the ceramic body, side portions of each of the external electrodes covering corresponding edges of the side surfaces of the ceramic body, wherein the multi-layer ceramic electronic component satisfies the following:

$30\ \mu m \leq Ts \leq 100\ \mu m$, $6\ \mu m \leq T \leq 18\ \mu m$, $0.19 \leq (2T+t)/Ts \leq 1.55$, and $0.07 \leq t/Ts \leq 0.35$, where Ts represents a dimension of the ceramic body measured along the first axis, T represents a mean value of thickness dimensions of said upper and lower portions of one of the external electrodes measured along the first axis that cover the corresponding edges of the top and bottom surfaces of the ceramic body, and t represents a sum of thickness dimensions of the internal electrodes drawn into one of the electrode drawn sections that is covered by said one of the external electrodes.

2. The multi-layer ceramic electronic component according to claim 1, wherein the multi-layer ceramic electronic component further satisfies $0.40 \leq (2T+t)/Ts \leq 1.00$.

3. The multi-layer ceramic electronic component according to claim 1, wherein the multi-layer ceramic electronic component further satisfies $30\ \mu m \leq Ts \leq 80\ \mu m$.

4. The multi-layer ceramic electronic component according to claim 1, wherein the multi-layer ceramic electronic component further satisfies $1 \leq T/t$.

5. A circuit board, comprising
the multi-layer ceramic electronic component according to claim 1.

* * * * *